(12) United States Patent
Briggs et al.

(10) Patent No.: US 10,099,108 B2
(45) Date of Patent: Oct. 16, 2018

(54) DYNAMIC RIGIDITY MECHANISM

(71) Applicant: International Business Machines Corporation, Armonk, NY (US)

(72) Inventors: Benjamin D. Briggs, Waterford, NY (US); Lawrence A. Clevenger, Rhinebeck, NY (US); Bartlet H. DeProspo, Goshen, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/187,045

(22) Filed: Jun. 20, 2016

(65) Prior Publication Data

US 2017/0361201 A1 Dec. 21, 2017

(51) Int. Cl.
| | |
|---|---|
| *A63C 5/07* | (2006.01) |
| *H05K 5/00* | (2006.01) |
| *H02J 7/00* | (2006.01) |
| *A63C 5/12* | (2006.01) |

(52) U.S. Cl.
CPC .............. *A63C 5/07* (2013.01); *A63C 5/12* (2013.01); *A63C 5/126* (2013.01); *H02J 7/0063* (2013.01); *H05K 5/0086* (2013.01); *H02J 2007/0067* (2013.01)

(58) Field of Classification Search
CPC ...................................................... A63C 5/07
USPC ...................................................... 280/602
See application file for complete search history.

(56) References Cited

U.S. PATENT DOCUMENTS

| | | | |
|---|---|---|---|
| 3,300,226 A | 1/1967 | Reed, Jr. | |
| 4,221,400 A | 9/1980 | Powers | |
| 4,577,886 A | 3/1986 | Chernega | |
| 5,301,965 A | 4/1994 | Floreani | |
| 5,674,135 A | 10/1997 | Franco et al. | |
| 5,775,715 A * | 7/1998 | Vandergrift | A63C 5/075 280/602 |

(Continued)

FOREIGN PATENT DOCUMENTS

| | | |
|---|---|---|
| EP | 0700698 A1 | 3/1996 |
| EP | 1186326 A2 | 3/2002 |
| EP | 2138208 B1 | 8/2011 |

*Primary Examiner* — Jeffrey J Restifo
(74) *Attorney, Agent, or Firm* — Cantor Colburn LLP; Vazken Alexanian

(57) ABSTRACT

Embodiments are directed to a support apparatus. The support apparatus might comprise a body configured to support an entity. The body might comprise a material that has a physical property. The support apparatus might further comprise a coupler system configured to couple electric current from a power source to the material. The material is arranged such that coupling an electric current to the material changes the physical property of the material. Embodiments are further directed to a method. The method might comprise forming one or more cavities in a support apparatus. The method might further comprise providing one or more couplers in electrical contact with each of the one or more channels. The method further comprises filling each of the one or more cavities with a fluid that has electrically changeable rigidity. Finally, the method might comprise connecting a power source to each of the one or more couplers.

9 Claims, 5 Drawing Sheets

(56) References Cited

U.S. PATENT DOCUMENTS

| | | | | |
|---|---|---|---|---|
| 5,775,716 A * | 7/1998 | Harsanyi | A63C 5/07 280/602 |
| 5,779,257 A | 7/1998 | Bonvallet et al. | |
| 5,857,694 A * | 1/1999 | Lazarus | A63C 5/075 280/601 |
| 6,086,490 A * | 7/2000 | Spangler | A63C 5/075 473/520 |
| 6,095,547 A * | 8/2000 | Vandergrift | A63C 5/075 280/602 |
| 6,102,426 A * | 8/2000 | Lazarus | A63C 5/075 280/602 |
| 6,196,935 B1 * | 3/2001 | Spangler | A63C 5/075 310/326 |
| 6,345,834 B1 * | 2/2002 | Bianchini | A63C 5/03 280/14.1 |
| 6,676,151 B2 | 1/2004 | Mangold et al. | |
| 6,883,823 B2 | 4/2005 | Riepler et al. | |
| 7,080,849 B2 * | 7/2006 | Lammer | A63C 5/075 280/602 |
| 7,219,449 B1 * | 5/2007 | Hoffberg | A43B 1/0054 36/29 |
| 8,678,958 B2 * | 3/2014 | Kuwabara | A63B 43/06 473/520 |
| 9,024,462 B2 * | 5/2015 | Thramann | H02N 11/008 280/602 |
| 2004/0100067 A1 | 5/2004 | Riepler et al. | |
| 2004/0152544 A1 * | 8/2004 | Lammer | A63B 49/02 473/520 |
| 2005/0127638 A1 | 6/2005 | Feichtlbauer et al. | |
| 2005/0151350 A1 * | 7/2005 | Watson | A63C 5/07 280/602 |
| 2006/0248750 A1 * | 11/2006 | Rosenberg | A43B 1/0054 36/29 |
| 2007/0107778 A1 * | 5/2007 | Bettin | A42B 3/121 137/13 |
| 2015/0079012 A1 * | 3/2015 | Bellas | A61K 8/64 424/62 |
| 2016/0008697 A1 | 1/2016 | Puget et al. | |
| 2017/0150780 A1 * | 6/2017 | Walker | A43B 13/189 |
| 2017/0203192 A1 * | 7/2017 | Nazarian | A63C 5/07 |

* cited by examiner

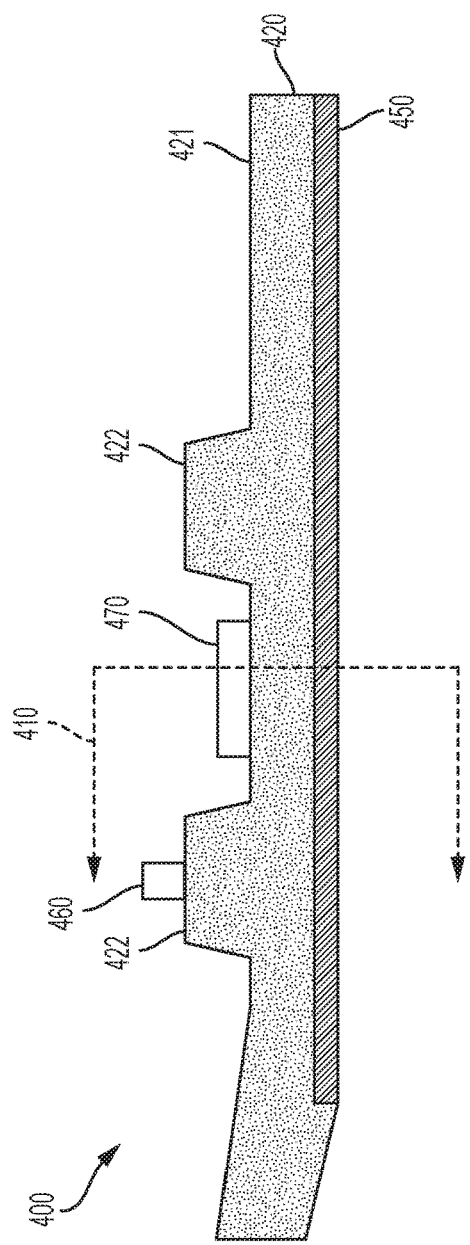
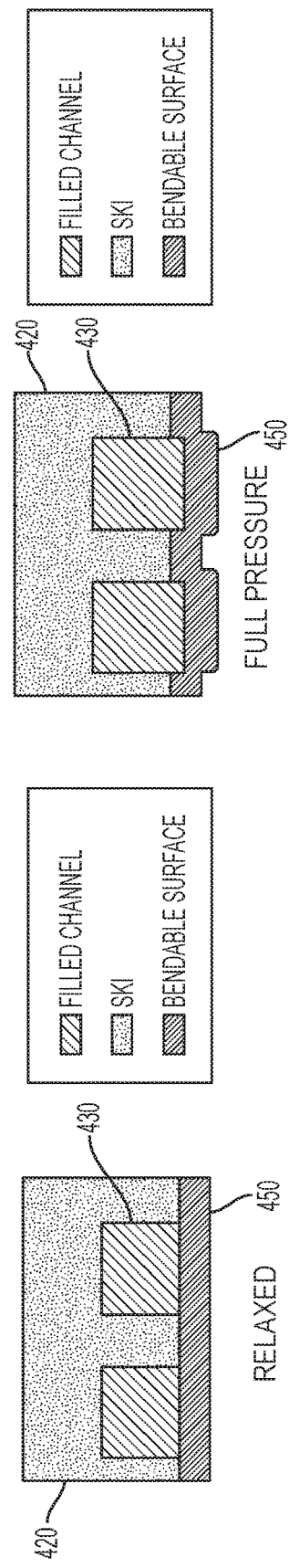
FIG. 4A
FIG. 4B
FIG. 4C

DYNAMIC RIGIDITY MECHANISM

BACKGROUND

The present disclosure relates in general to the field of support structures. More specifically, the present disclosure relates to systems and methodologies for dynamically adjusting the support characteristics of a support structure.

Support structures are used in a variety of applications to support an entity. For example, skis are used as support structures to support a person (i.e., an entity). In many applications, the stiffness or rigidity of the support structure/equipment can be important to users. For example, in snow sports, the stiffness or rigidity of a pair of skis or a snowboard can greatly affect the behavior of the skis or snowboard. Generally speaking, a stiffer ski provides the user with better edge control and better handling at higher speeds. Skis used for freestyle are generally manufactured from relatively soft materials that are more pliable. If a skier wants to use both a stiff ski for some mountains and a less stiff ski for other mountains, the user would have to utilize multiple sets of skis.

SUMMARY

Embodiments are directed to a support apparatus. The support apparatus might comprise a body configured to support an entity. The body might comprise a material that has a physical property. The support apparatus might further comprise a coupler system configured to couple electric current from a power source to the material. The material is arranged such that coupling an electric current to the material changes the physical property of the material.

Embodiments are further directed to a method. The method might comprise forming one or more cavities in a snow riding apparatus. The method might further comprise providing one or more couplers in electrical contact with each of the one or more channels. The method further comprises filling each of the one or more cavities with a fluid that has electrically changeable rigidity. Finally, the method might comprise connecting a power source to each of the one or more couplers.

Embodiments are further directed to a method. The method might comprise forming one or more cavities in a body. The method might further comprise providing one or more couplers in electrical communication with each of the one or more cavities. The method might further comprise filling each of the one or more cavities with a fluid and connecting a power source to each of the one or more couplers. The method might further comprise placing a bendable surface on a bottom surface of the body. The application of an electric current to the material causes the fluid to expand, which causes at least a portion of the bendable surface to extend from the body.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 4A depicts the construction of another embodiment;
FIG. 4B depicts a cut-away view of the embodiment shown in FIG. 4A in a relaxed state;
FIG. 4C depicts a cut-away view of the embodiment shown in FIG. 4A in an expanded state.

DETAILED DESCRIPTION

Figure 1:
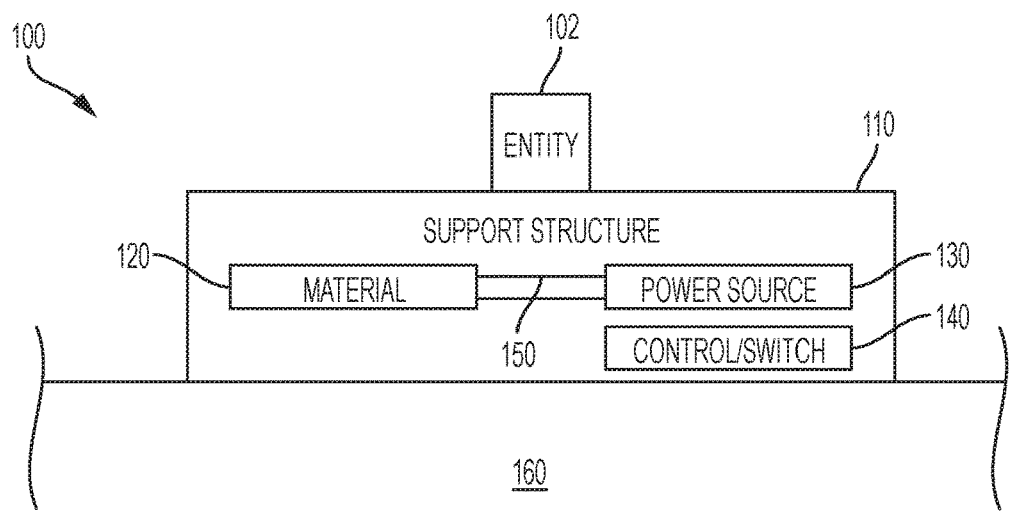
FIG. 1 depicts the construction of an embodiment.

Various embodiments of the present disclosure will now be described with reference to the related drawings. Alternate embodiments may be devised without departing from the scope of this disclosure. Various connections might be set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

At least the features and combinations of features described in the present application, including the corresponding features and combinations of features depicted in the figures, amount to significantly more than implementing a method and system for a dynamic rigidity mechanism. Additionally, at least the features and combinations of features described in the present application, including the corresponding features and combinations of features depicted in the figures, go beyond what is well-understood, routine and conventional in the relevant field(s).

The support and transportation of people and other entities across bodies of water or across snow or ice covered land has a long history. Skis are common forms of support devices used to support and transport people and other entities across snow. Typically, a skier attaches a single ski to each foot and uses the skis to travel across snow-covered ground. In recent history, other forms of snow transportation have also become popular. Included among these forms of transportation is the snowboard. Typically, a person attaches both feet to a single snowboard to travel across snow-covered ground. In addition to being a form of transportation, skis and snowboards are often used recreationally, such as for riding down a mountain or at a ski park. Skis can also be present in other types of transportation devices, such as being used in sleds, snowmobiles, and the like.

As described above, skis and snowboards are typically manufactured from materials with certain characteristics, such as a specific rigidity or stiffness, and amount of friction, and cannot be changed. A typical ski might have a core made of wood, carbon fiber, titanium, aluminum, and the like, surrounded by composite materials such as fiberglass. However, a skier might want to ski at different locations that have different types of terrain. One location might have terrain that is conducive to a relatively stiff ski. Another location might have terrain that is conducive to a more flexible ski. Such as skier would have to resort to buying or renting multiple skis for different terrain. (It should be understood that any reference to "ski" in this disclosure can also be applicable to a snowboard and other support structures.)

The present disclosure presents a support apparatus with modifiable mechanical properties that can be dynamically tuned based on conditions and preferences. One embodiment uses microfluidic cavities or channels in the skis. The channels contain a fluid, such as a gel, that changes mechanical properties when electrically stimulated.

With reference to FIG. 1, a diagram of an embodiment 100 is shown. An entity can be a person or thing to be supported. Support structure 110 might be a ski, a snowboard, or the like.

Material 120 has one or more physical properties. In some embodiments, material 120 might be a liquid or gel material that has physical properties that can be altered by the application of electricity. An exemplary material can include a silk-based material, such as a silk fibroin gel. The physical property might be the rigidity of the material. Because material 120 is located within support structure 110, the rigidity of material 120 impacts the rigidity of the overall support structure 110. A silk fibroin gel or other silk-based material has electrogelation properties in which the rigidity of the material changes upon the application of an electrical current. Other materials also can be used.

Coupled to material 120 is coupler system 150. Coupler system 150 can comprise multiple couplers that couple material 120 to power source 130. In some embodiments, the couplers of coupler system 150 can include one or more electrodes.

In some embodiments, the power source 130 might be a battery. In some embodiments, other forms of power sources can be used. In some embodiments, power source 130 is capable of supplying 0.4 milliamps (mA) to each of the one or more cavities. In such embodiments, 0.4 mA might be the minimum current to initiate a change in the liquid/gel material. In some embodiments, the power source is capable of providing current with a potential of 3.3 volts. A variety of different types of batteries can be used. In some embodiments, a lithium polymer (LiPo) battery can be used. In some embodiments, a lithium ion battery can be used. In some embodiments, traditional AA or AAA batteries can be used. In some embodiments, the battery can be rechargeable. In such a case, there might be a weather-sealed recharging port to allow the charging of the power source, while being protected from weather conditions while not charging. In other embodiments, the battery might be configured to allow wireless charging.

Terrain/water 160 might be any type of terrain or bodies of water upon which entity 102 might travel using support structure 110. The terrain can include snow-covered terrain, ice, bodies of water such as rivers, lakes, oceans, and the like.

Controller 140 might be a switch, the computer system 200 (shown in FIG. 2), or the like. Controller 140 might be integral with the support structure 110 or may be external to the support structure 110. When external to the support structure 110, controller 140 may operate to wirelessly control the power source 130 in order to control the amount of electric current that flows from the power source 130 to the material 120. In some embodiments, the controller is configured to determine, based on a variety of factors (the nature of the terrain, the size/shape/weight of the support structure, etc.) the amount of electric current that is needed in order to achieve the desired physical property of material, as well as the desired physical property of the overall support structure.

Figure 2:
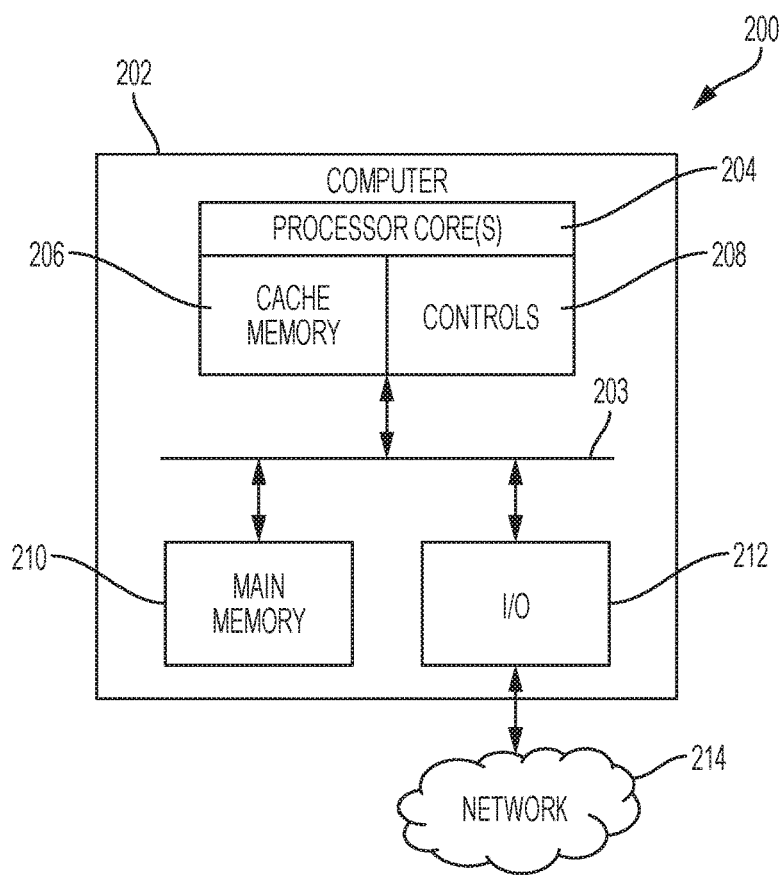
FIG. 2 depicts a computer system configured for implementing an embodiment.

Turning now to the drawings in greater detail, wherein like reference numerals indicate like elements, FIG. 2 illustrates an example of a computer system 200 including an exemplary computing device ("computer") 202 configured for implementing one or more embodiments of the controller/switch 140 (shown in FIG. 1) in accordance with the present disclosure. In addition to computer 202, exemplary computer system 200 can include network 214, which couples computer 202 to additional systems (not depicted) and may include one or more wide area networks (WANs), local area networks (LANs) such as the internet, intranet(s), and/or wireless communication network(s), or ad-hoc networks. Computer 202 and additional system may be in communication via network 214, e.g., to communicate data between them.

Exemplary computer 202 includes processor cores 204, main memory ("memory") 210, and input/output component(s) 212, which are in communication via bus 203. Processor cores 204 includes cache memory ("cache") 206 and controls 208. Cache 206 may include multiple cache levels (not depicted) that are on or off-chip from processor 204. Memory 210 may include various data stored therein, e.g., instructions, software, routines, etc., which, e.g., may be transferred to/from cache 206 by controls 208 for execution by processor 204. Input/output component(s) 212 may include one or more components that facilitate local and/or remote input/output operations to/from computer 202, such as a display, keyboard, modem, wireless network adapter, etc. (not depicted).

Figure 3A:
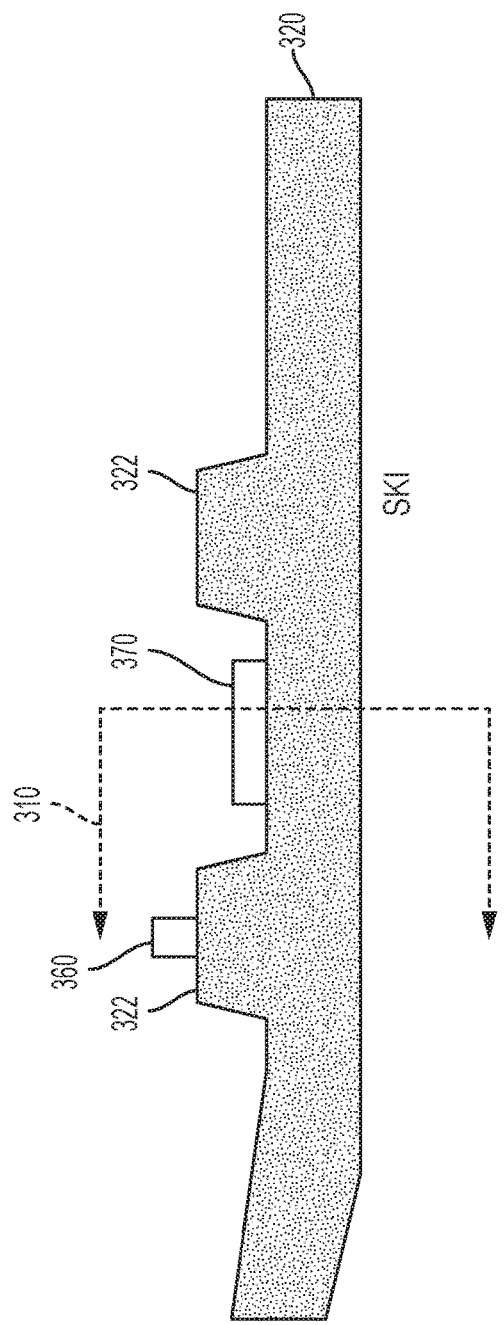
FIG. 3A depicts the construction of an embodiment.
Figure 3B:
FIG. 3B depicts a cut-away view of the embodiment shown in FIG. 3A.

With reference to FIG. 3A, a diagram of another embodiment is shown. Ski 320 contains bindings 322. A cutaway at line 310 shows the interior of skis 320 in FIG. 3B. Channels 330 and 332 are shown in FIG. 3B as being filled with a material (such as a silk-based material) that changes property based on the application of electricity. (It should be understood that channels 330 and 332 are present in FIG. 3A, but are not shown). Electrode 340 accepts an electrical input and distributes the electrical input to both channel 330 and channel 332. In some embodiments, electrode 340 can be located within binding 322. A power source 370 is shown on FIG. 2A. Although power source 370 is shown external to the ski in FIG. 2A, it should be understood that power source 370 can be installed in a channel in some embodiments. In other embodiments, power source 370 can be integrated with the binding 322.

In operation, there might be a switch 360 that controls the amount of electricity provided to the electrode contact. The properties of the liquid/gel material changes based on the amount of electricity provided to the electrode contact for each channel. In some embodiments, the switch might be a simple, mechanical on/off switch. In some embodiments, the switch provides more than one level of voltage or current to the electrode contact, thus allowing for multiple rigidity levels. In some embodiments switch 360 is integrated with a binding 322. In some embodiments, the switch might be located on the ski or the battery. In some embodiments, the switch is an electronic switch, such as a relay or an integrated circuit. In some embodiments, the switch might be capable of wireless use. In such a case, there might be a receiver on the ski that detects the operation of the wireless switch and adjusts the voltage or current levels based on the settings of the wireless switch. Thus, the switch can be located external to the ski. In some embodiments, the switch external to the ski might be located on a ski pole used by the skier. In some embodiments, the switch can be a handheld switch to be carried by the skier or attached to the skier. In some embodiments, the switch can be a mobile app or other computer program product installed, for example, on a smartphone. In some embodiments, the switch can be computer system 200. In some embodiments, the switch can also have a mode where the polarity of the electrical current can be changed, thus reversing the electrogelation process. In some embodiments, the mobile app can have adaptive capabilities of determining an amount of current to apply based on conditions or desired characteristics.

With reference to FIG. 4A another embodiment 400 is shown. A cross section at line 410 is shown in FIGS. 4B and 4C. Ski 420 contains a top surface 421 and bindings 422. Ski 420 contains a channel 430. In a similar manner as described above with respect to FIG. 3A, there might be a switch 460 and a power source 470. Within channel 430 is a fluid. Attached to the bottom surface of the ski is a bendable surface 450. FIG. 4B illustrates the cross-section taken at line 410 when no voltage is applied. Bendable surface 450 presents as a flat surface. When voltage is applied to electrodes (not shown), the situation of FIG. 4C is the result. The fluid expands, causing the bendable surface 450 to change shape, changing the topography of the ski. The result is a different coefficient of friction in the ski. The expansion of the fluid can be caused by a power screw located within the channel or by one of a variety of different methods. The application of a current to the electrodes causes the power screw to move the fluid, which in turn, moves the bendable surface. The change in topography might result in a lower or higher coefficient of friction in the ski, changing the top speed of the ski. Thus, a skier might use such a feature to change the coefficient of friction in an attempt to change his top speed in certain terrain.

Figure 5:
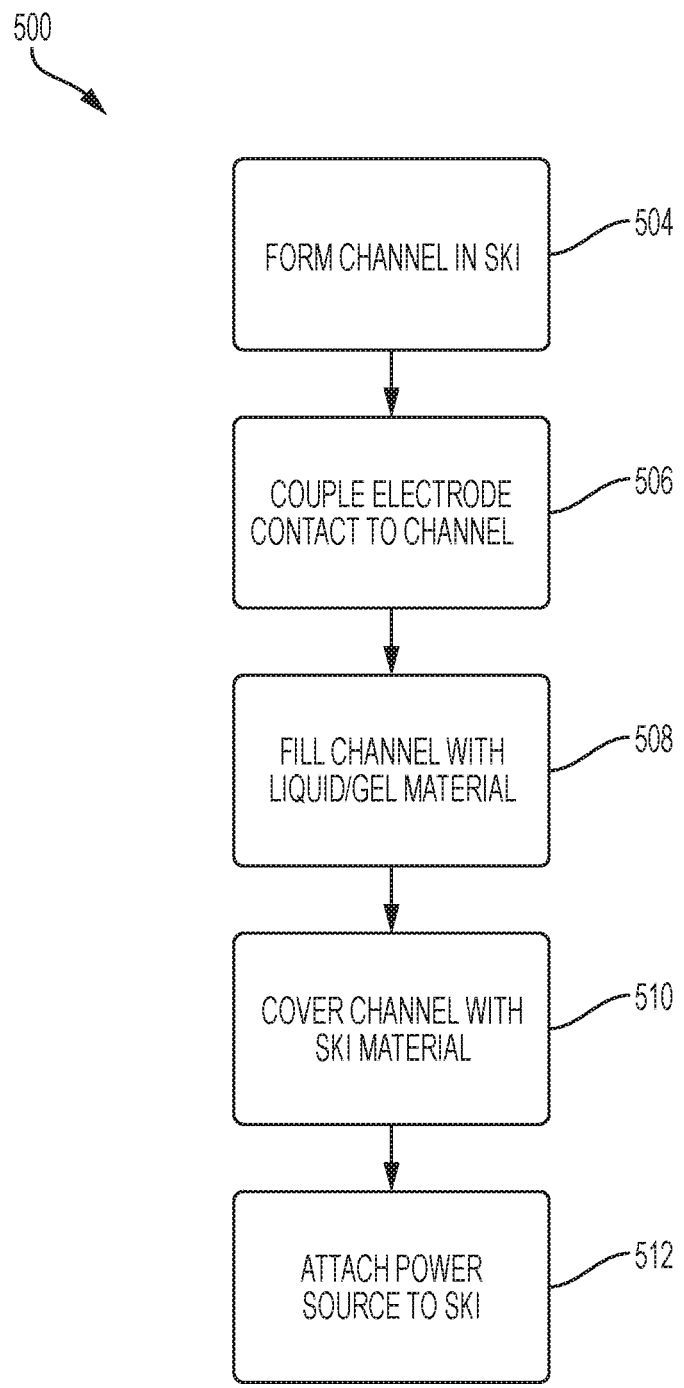
FIG. 5 depicts a flowchart illustrating a method of constructing an embodiment.

A flowchart illustrating a method 500 is presented in FIG. 5. Method 500 is merely exemplary and is not limited to the embodiments presented herein. Method 500 can be employed in many different embodiments or examples not specifically depicted or described herein. In some embodiments, the procedures, processes, and/or activities of method 500 can be performed in the order presented. In other embodiments, the procedures, processes, and/or activities of method 500 can be performed in any other suitable order. In still other embodiments, one or more of the procedures, processes, and/or activities of method 500 can be combined or skipped.

Given a body configured to support an entity, such as a ski configured to support a person, one or more cavities or channels are formed on the interior of the body (block 504). A coupler is provided that is coupled to each channel (block 506). The coupler might be an electrode or other type of device configured to receive electricity. Other types of devices can be used to couple electric energy to the fluid. The one or more cavities are filled with a fluid, such as a liquid/gel material (block 508). The liquid/gel material has mechanical properties (such as viscosity or modulus of elasticity) that can be altered by the application of a voltage. An exemplary material can include a silk fibroin gel. A silk fibroin gel has electrogelation properties in which the rigidity of the material changes upon the application of an electrical current. The one or more cavities can be filled with any type of material commonly used in such a support apparatus, such as fiberglass (block 510).

A power source can be attached to the body (block 512). In some embodiments, the power source is a battery. In some embodiments, other forms of power sources can be used. In some embodiments, the power source is attached to the outside of the body. In such a case, there might be a sealant applied to the power source to prevent damage from snow and other elements. In some embodiments, the power source is located within a channel in the ski. In some embodiments, the power supply is capable of supplying 0.4 milliamps (mA) to each of the one or more cavities. In such embodiments, 0.4 mA might be the minimum current to initiate a change in the liquid/gel material. In some embodiments, the power supply is capable of providing current with a potential of 3.3 volts. A variety of different types of batteries can be used. In some embodiments, a lithium polymer (LiPo) battery can be used. In some embodiments, a lithium ion battery can be used. In some embodiments, traditional AA or AAA batteries can be used. In some embodiments, the battery can be rechargeable. In such a case, there might be a weather-sealed recharging port. In other embodiments, the battery might be configured to allow wireless charging.

Figure 6:
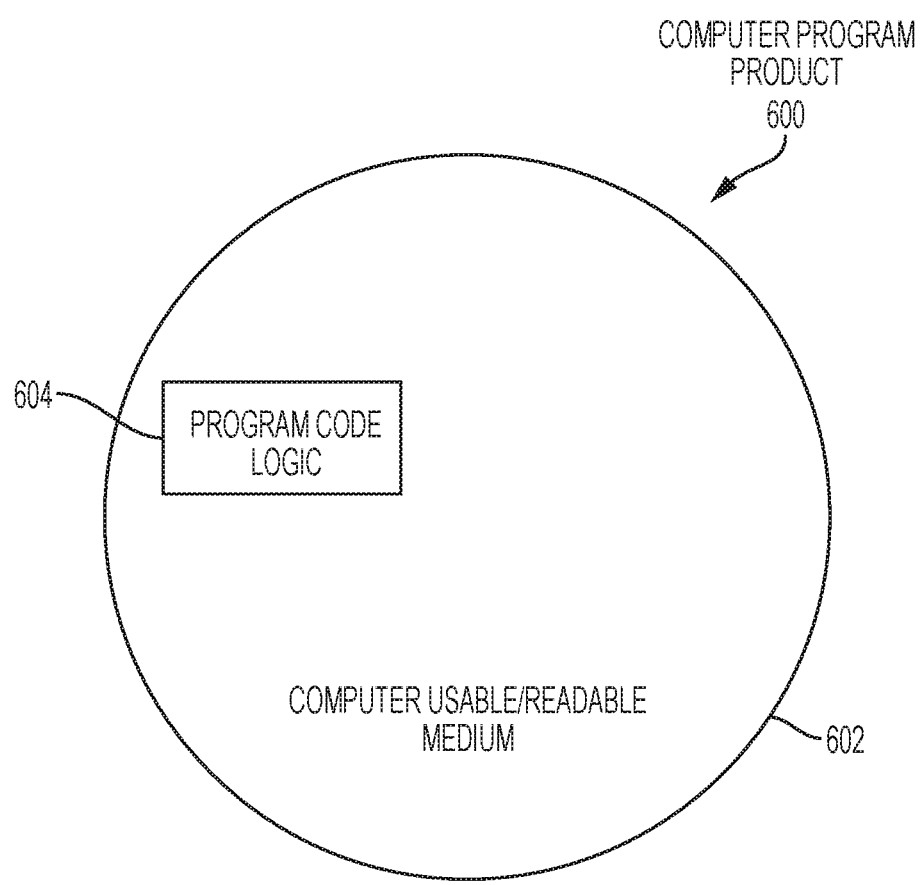
FIG. 6 depicts a computer program product of an embodiment.

Referring now to FIG. 6, a computer program product 600 in accordance with an embodiment that includes a computer-readable storage medium 602 and program instructions 604 is generally shown.

The present disclosure may include a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may include assembler instructions, instruction-set-architecture (ISA) instructions, machine instructions, machine dependent instructions, microcode, firmware instructions, state-setting data, or either source code or object code written in any combination of one or more programming languages, including an objectoriented programming language such as Smalltalk, C++ or the like, and conventional procedural programming languages, such as the "C" programming language or similar programming languages. The computer-readable program instructions may execute entirely on the entity's computer, partly on the entity's computer, as a stand-alone software package, partly on the entity's computer and partly on a remote computer or entirely on the remote computer or server. In the latter scenario, the remote computer may be connected to the entity's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A flexible sport runner apparatus comprising:
    a body configured to support an entity, wherein the body comprises a material having a physical property; and
    a coupler system configured to couple electric current from a power source to the material;
    wherein coupling electric current to the material changes the physical property of the material wherein:
    the material comprises a fluid that is configured to change rigidity upon the application of current to the one or more couplers; and
    the fluid is a silk-based material that has electrogelation properties.

2. The flexible sport runner apparatus of claim 1 further comprising:
    wherein the body contains one or more cavities;
    wherein each of the one or more cavities is filled with a fluid; and
    wherein the application of an electric current to each of the one or more couplers results in a change in rigidity of the fluid.

3. The flexible sport runner apparatus of claim 1 further comprising:
    a power source electrically coupled to each of the one or more couplers.

4. The flexible sport runner apparatus of claim 3 wherein the power source is placed in one of the one or more cavities.

5. The flexible sport runner apparatus of claim 4 wherein the power source is a lithium polymer (LiPo) battery.

6. The flexible sport runner apparatus of claim 3 further comprising:
   a switch coupled to the power source; wherein:
      the switch is configured to control an amount of electric current flowing from the power source.

7. The flexible sport runner apparatus of claim 6 wherein:
   the switch is configured to determine an amount of current to flow from the power source to the coupling system.

8. The flexible sport runner apparatus of claim 1 further comprising:
   a bendable surface applied to the body;
   wherein an application of an electric current through the coupling system to the fluid changes an amount of pressure that is applied to the bendable surface.

9. The flexible sport runner apparatus of claim 8 wherein:
   the application of the electrical current causes the fluid within the channel to expand, which causes the bendable surface to extend from the body.

* * * * *